US 006363501B1

United States Patent
Tobias et al.

(10) Patent No.: US 6,363,501 B1
(45) Date of Patent: Mar. 26, 2002

(54) METHOD AND APPARATUS FOR SAVING AND LOADING PERIPHERAL DEVICE STATES OF A MICROCONTROLLER VIA A SCAN PATH

(75) Inventors: David F. Tobias, Pflugerville; Richard G. Russell; Mark T. Ellis, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/209,190

(22) Filed: Dec. 10, 1998

(51) Int. Cl.$^7$ ............................................. G01R 31/28
(52) U.S. Cl. ........................ 714/30; 714/726; 710/8
(58) Field of Search ........................... 714/30, 31, 727, 714/729, 726; 367/18; 710/8–10, 62–74; 371/22–27; 368/97.01, 121, 244, 246.6

(56) References Cited

U.S. PATENT DOCUMENTS

| | | | |
|---|---|---|---|
| 4,947,357 A | | 8/1990 | Stewart |
| 5,157,781 A | * | 10/1992 | Harwood et al. ............. 714/30 |
| 5,281,864 A | | 1/1994 | Hahn et al. |
| 5,291,495 A | | 3/1994 | Udell, Jr. |
| 5,301,156 A | * | 4/1994 | Talley ........................ 365/201 |
| 5,325,368 A | | 6/1994 | James et al. |
| 5,329,533 A | | 7/1994 | Lin |
| 5,377,200 A | * | 12/1994 | Pedneau ..................... 714/733 |
| 5,416,409 A | | 5/1995 | Hunter |
| 5,423,050 A | * | 6/1995 | Taylor et al. ................. 714/31 |
| 5,428,622 A | * | 6/1995 | Kuban et al. ............... 714/729 |
| 5,428,623 A | * | 6/1995 | Rahman et al. ............ 714/726 |
| 5,434,804 A | | 7/1995 | Bock et al. |
| 5,477,545 A | | 12/1995 | Huang |
| 5,608,736 A | | 3/1997 | Bradford et al. |
| 5,610,926 A | * | 3/1997 | Marris ........................ 714/726 |
| 5,623,503 A | | 4/1997 | Rutkowski |
| 5,627,841 A | | 5/1997 | Nakamura |
| 5,627,842 A | * | 5/1997 | Brown et al. ................ 714/727 |
| 5,636,228 A | | 6/1997 | Moughanni et al. |
| 5,668,490 A | | 9/1997 | Mitra et al. |
| 5,694,399 A | * | 12/1997 | Jacobson et al. ........... 709/246 |
| 5,703,818 A | * | 12/1997 | Osawa ........................ 365/201 |
| 5,717,701 A | | 2/1998 | Angelotti et al. |
| 5,726,999 A | | 3/1998 | Bradford et al. |
| 5,784,382 A | * | 7/1998 | Byers et al. ................. 714/726 |
| 5,815,706 A | * | 9/1998 | Stewart et al. ................. 713/2 |
| 5,841,792 A | * | 11/1998 | Kawano et al. ............. 714/733 |
| 5,898,232 A | * | 4/1999 | Reents et al. ................. 307/18 |
| 5,968,196 A | * | 10/1999 | Ramamurthy et al. ...... 714/727 |
| 6,020,757 A | * | 2/2000 | Jenkins, IV .................. 326/39 |
| 6,097,988 A | * | 8/2000 | Tobias ........................ 700/23 |
| 6,102,963 A | * | 8/2000 | Agrawl ........................ 716/17 |
| 6,125,463 A | * | 9/2000 | Macchi ........................ 714/726 |

* cited by examiner

Primary Examiner—Christopher B. Shin
(74) Attorney, Agent, or Firm—Akin, Gump, Strauss, Hauer & Feld LLP

(57) ABSTRACT

A microcontroller has many internal peripheral devices. The peripheral devices are coupled to a scan path. A memory storage device that is external to the microcontroller is also coupled to the scan path. When commanded, data is shifted out of each device configuration register onto the scan path and stored in the external memory device. This is particularly useful for obtaining the states of each device without bringing down the application. Furthermore, configuration data stored in external memory can be loaded into the peripheral device configuration registers via the scan path. This invention also supports zero-volt suspend/resume which does not need extra software readable shadow registers which are often required in other architectures for reading back the current state of legacy registers which are read-only.

5 Claims, 5 Drawing Sheets

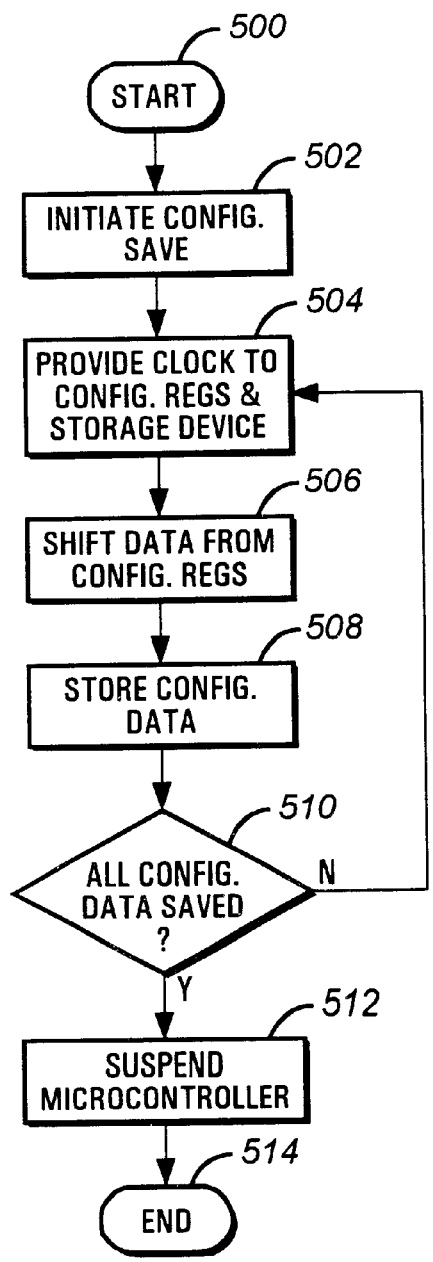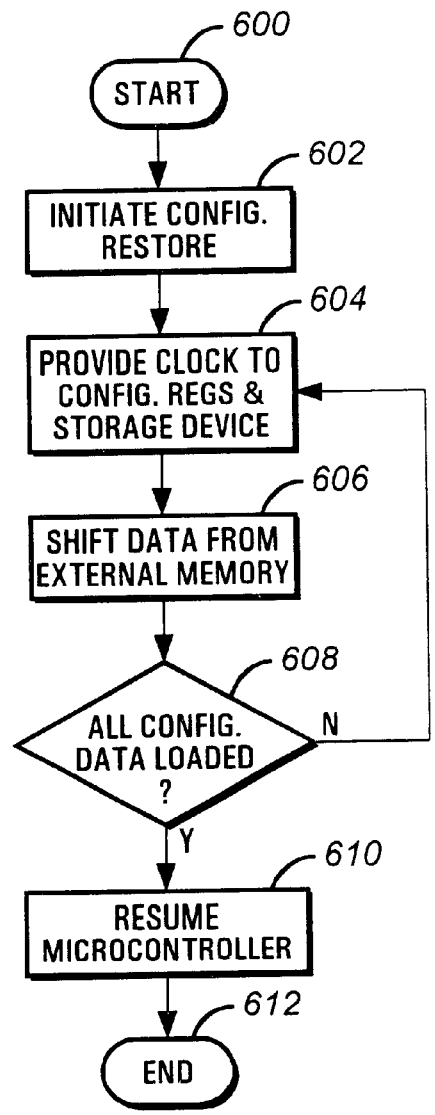
FIG. 5
FIG. 6

METHOD AND APPARATUS FOR SAVING AND LOADING PERIPHERAL DEVICE STATES OF A MICROCONTROLLER VIA A SCAN PATH

BACKGROUND OF THE INVENTION

1. Field of the Invention

The apparatus and method according to the invention pertains to peripheral states registers embedded in a microcontrollers, and more specifically, using scan hardware to capture peripheral device states.

2. Description of the Related Art

The proliferation of electronic goods such as telephones, televisions, and video camcorders has been made possible by integrated circuit technology. One type of integrated circuit especially important to electronic devices is the microcontroller.

A microcontroller, or embedded controller, is similar to a microprocessor as used in a personal computer, but with a great deal of additional functionality combined onto the same monolithic semiconductor substrate (i.e., chip). In a typical personal computer, the microprocessor performs the basic computing functions, but other integrated circuits perform functions such as communicating over a network, providing input/output with the user, and controlling peripherals.

In a typical microcontroller, many of these functions are embedded within the integrated circuit chip itself. A typical microcontroller, such as the Am186ES by Advanced Micro Devices, Inc., of Sunnyvale, Calif., not only includes a core microprocessor, but further includes a memory controller, a direct memory access (DMA) controller, an interrupt controller, and both asynchronous and synchronous serial interfaces. In computer systems, these peripheral devices are typically implemented as separate integrated circuits, requiring a larger area and increasing the size of the product. By embedding these functions within a single chip, size and cost are reduced, often important in consumer products.

From a consumer products designer's viewpoint, often the particular combination of added features make a particular microcontroller attractive for a given application. Many microcontrollers are available that use the standard 80x86 microprocessor instructions, allowing for software to be easily developed for such microcontrollers. Because of the similar execution unit instruction sets, the added features often become principal differentiating criteria between particular microcontrollers.

The peripheral devices embedded in a microcontroller each have their own individual registers. Typical peripheral device registers include state registers, instruction registers, address registers, status registers and data registers. Depending on the peripheral, certain registers store configuration information needed for the peripheral's proper operation during start up. On system start up, the execution unit initializes each peripheral device with device specific initial configuration data. This initialization could occur during a cold start-up, zero-volt suspend/resume procedure or after a system crash.

In addition to having peripheral devices, many of today's microcontrollers have embedded test circuitry. In 1985, a group of European companies formed Joint European Test Action Group (JETAG) to devise ways to reduce manufacturing costs. One concept was to incorporate such test circuitry into standard components (controlled via software), eliminating the need for sophisticated in-circuit test equipment. This concept gained support in the U.S., where in 1988, several North American companies formed the Joint Test Access Group (JTAG) consortium to formalize the concept. In 1990, the Institute of Electrical and Electronic Engineers (IEEE) refined the concept and created the 1149.1 standard (which is incorporated herein by reference), known as IEEE Standard Test Access Port and Boundary Scan Architecture.

In such an architecture, a JTAG test device is connected to a microcontroller and performs a "boundary-scan test" on the microcontroller. Boundary scan cells contain shift register elements that connect together to form a scan chain around the core logic circuit. Input/output (I/O) signals freely pass between integrated circuit (IC) pins and the core logic, through the boundary scan cells, in normal mode. However, in test mode, only test signals are allowed to pass into or out of the core logic, via a test port and through the boundary scan chain, providing observability and controllability of the input and output signals. The JTAG test commands are typically drawn from a fairly limited set of commands particularly adapted for testing the interconnections of microcontrollers and are not typically well suited for testing or monitoring its internal logic. Instructions and associated data for testing are read serially into each microcontroller peripheral boundary scan cell registers and read out serially, and after the instructions has been carried out the result is read out serially.

While boundary scan techniques are useful in testing interconnection between components, the scan path does not include internal logic registers. In full scan path design typically all registers and storage elements are connected in the scan paths.

Furthermore, access to registers of peripheral devices may not be possible using I/O commands. Some of these registers may not have both read/write capabilities. Thus, data cannot be written to read-only registers with processor I/O commands and data cannot be read from write-only registers with processor I/O commands.

SUMMARY OF THE INVENTION

According to the invention, the configuration states of peripheral devices that are embedded in a microcontroller are saved using scan hardware. Various configuration registers, both internal (non-I/O registers) and external (I/O registers), are connected in a configuration scan path internal to the peripheral device. When it is desirable to save the configuration state(s) of the peripheral device(s), the configuration scan path is scanned, and this data can be stored in an external memory device. The external memory device can either be volatile or non-volatile.

In addition, in one embodiment, the scan path is IEEE 1149.1 compliant. Furthermore, according to the invention, various configuration registers, both internal and external, can be saved to an external memory device without intervention of the execution unit of the microcontroller. Instead of the execution unit issuing read and write commands to the various configuration registers and an external memory, configuration data is scanned out to the external memory via a scan path.

Also according to the invention, the configuration states of peripheral devices can be loaded into peripheral device registers using scan hardware. Configuration states can be stored in external memory and shifted into the configuration registers of peripheral devices via a scan path.

Furthermore, according to the invention, configuration states of peripheral devices can be loaded into peripheral device registers that are read-only and saved from peripheral device registers that are write-only by using this scan path.

BRIEF DESCRIPTION OF THE DRAWINGS

A better understanding of the present invention can be obtained when the following detailed description of the preferred embodiment is considered in conjunction with the following drawings, in which:

FIG. 5 is a flow chart illustrating the method of saving the configuration states of a peripheral device; and FIG. 6 is a flow chart illustrating the method of loading the configuration states of a peripheral device.

DETAILED DESCRIPTION OF THE PREFERRED EMBODIMENT

Figure 1:
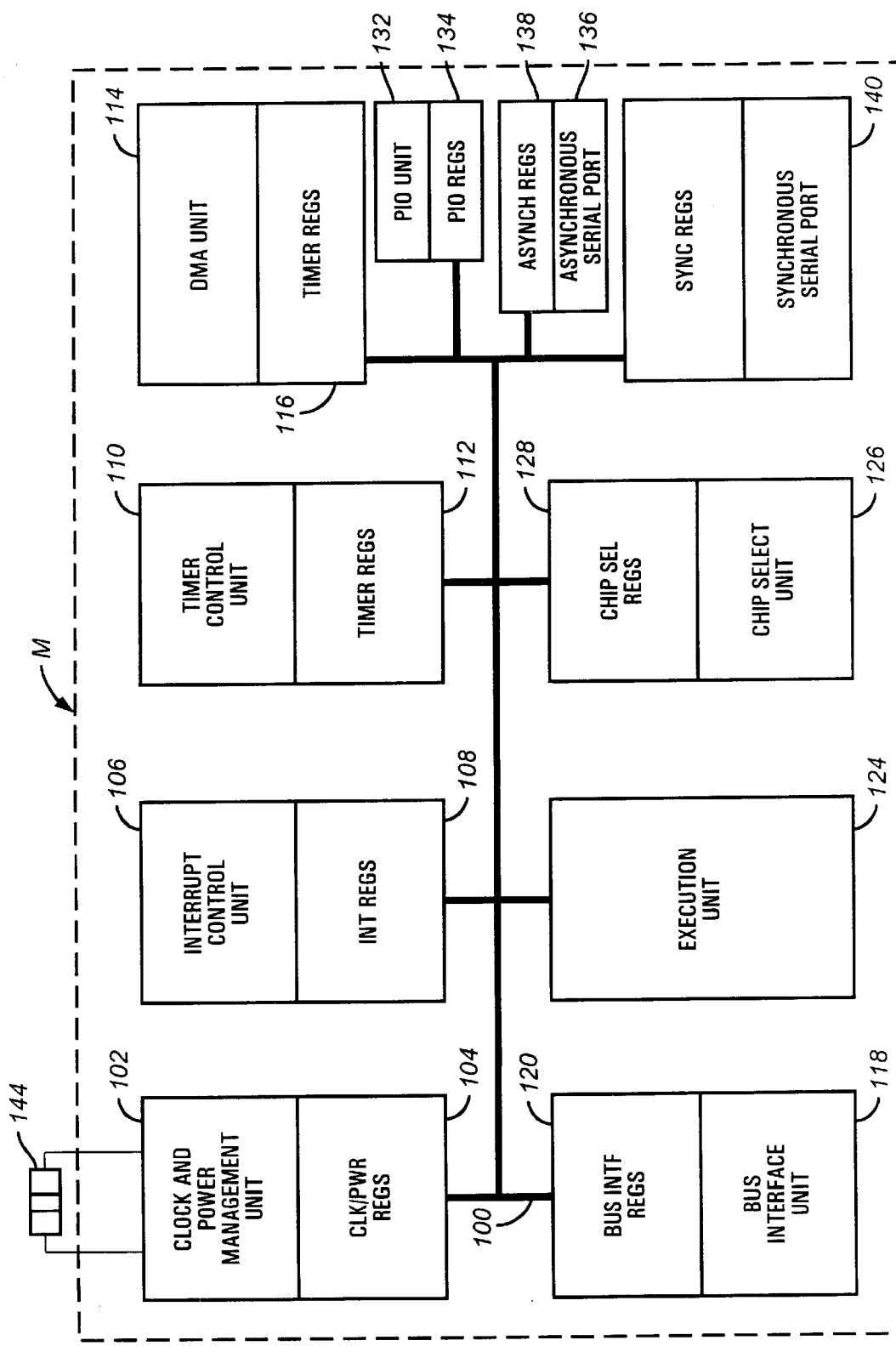
FIG. 1 shows a typical microcontroller in which the techniques of this invention can be implemented.

Turning to FIG. 1, shown is a block diagram of a typical microcontroller M implemented according to the invention. Such a microcontroller is preferably implemented on a single monolithic integrated circuit. The microcontroller M preferably includes an internal bus 100 coupling a variety of functional units and registers used to control and monitor those units. These include a clock and power management unit 102 with corresponding clock/power registers 104, an interrupt control unit (ICU) 106 with corresponding interrupt registers 108, a timer control unit 110 with corresponding timer registers 112, a direct memory access (DMA) unit 114 with corresponding DMA registers 116, a bus interface unit 118 with corresponding bus interface registers 120, an execution unit 124 which is essentially a microprocessor core, a chip select unit 126 with corresponding chip select registers 128, a programmable input/output (PIO) unit 132 with corresponding PIO registers 134, an asynchronous serial port 136 with corresponding asynchronous register 138, and a synchronous serial port 140 with corresponding synchronous registers 142. Further, note the clock and power management unit 102 includes external pads connected to a crystal 144, which provides the timing not only for the execution unit 124, but also for generating the serial clock in the asynchronous serial port 136.

The block diagram of the microcontroller M is typical of microcontrollers, and could be for example, the Am186ES microcontroller by Advanced Micro Devices, Inc., of Sunnyvale, Calif. The techniques and circuitry according to the invention, however, could be applied to a wide variety of microcontrollers as well as other devices that use a non-ideal clock for generation of asynchronous serial port clocks. Further, the term "microcontroller" has differing definitions in industry. Some companies refer to a processor core with additional features (such as I/O) as a "microprocessor" if it has no onboard memory, and digital signal processors (DSPs) are now used for both special and general purpose controller functions. So as here used, the term "microcontroller" covers all of the products, and generally means an execution unit with added functionality all implemented on a single monolithic integrated circuit.

SCAN HARDWARE

Microcontrollers that are IEEE 1149.1 compliant have boundary scan paths that couple the registers of peripheral device's I/O pins. Boundary scan provides access to the periphery of the microcontroller, but not the internal registers of the execution unit and peripheral devices. In full scan path design all registers are connected in the scan paths. Scan paths connect individual flip-flops within a register and then connect the registers, e.g., bit one of register one is connected to bit two of register one, and bit two is connected to bit three of register one, and so on until the last bit of register one is connected to bit one of register two. According to the invention, scan is implemented on sufficient registers to save configuration state of the device. Furthermore, it is not necessary to capture all data from each register to determine the state of the device. For instance, data from a status register may not be needed to determine the configuration state of the device.

Figure 2:
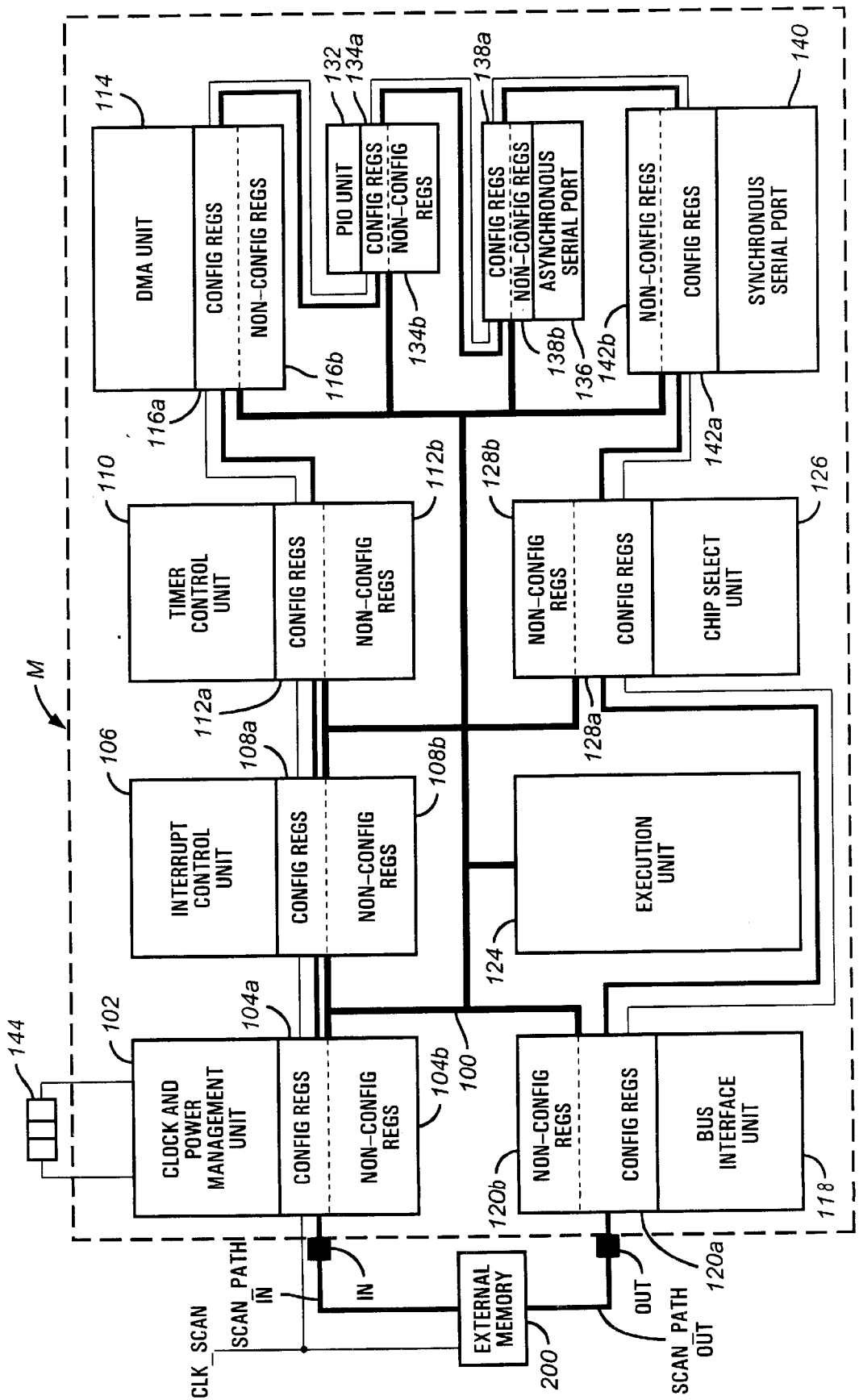
FIG. 2 is a block diagram illustrating a scan path between peripheral devices.

FIG. 2 illustrates typical peripheral devices embedded in a microcontroller M with a scan path. An input pin IN of microcontroller M is provided to shift configuration data into each peripheral configuration register. The configuration registers of the clock and power management unit 102, interrupt control unit 106, timer control unit 110, DMA unit 114, PIO unit 132, asynchronous serial port 136, synchronous serial port 140, chip select unit 126 and bus interface unit 118 are daisy chained together via signal line SCAN_PATH. For illustrative purposes, the SCAN_PATH line from the output of the bus interface unit configuration registers 120a is coupled to the output pin OUT of the microcontroller M. Data is synchronously shifted in or out of each configuration register utilizing clock CLK_SCAN. The data out pin OUT is coupled to an external memory 200. Thus, the configuration data from each peripheral device is sequentially shifted out of each configuration register into external memory 200 via SCAN_PATH. Likewise, the external memory 200 is coupled to the input pin IN, so that data from external memory 200 can be synchronously shifted into each peripheral configuration register via SCAN_PATH.

PERIPHERAL DEVICE REGISTERS

Peripheral devices embedded in microcontrollers have many different registers that store data for use in a variety of functions. Sometimes, registers necessarily define a configuration state of a peripheral. Other times, registers contain transitory information (such as UART receive status bits) that are not strictly needed to establish the peripheral's configuration. Further, whether a register has information "necessary" to define a peripheral configuration may depend on the particular implementation of the peripheral and its applications. As an illustration, one such peripheral device is an asynchronous serial port 136. A common asynchronous serial port is a Universal Asynchronous Receiver and Transmitter (UART) 300. The UART 300 is one peripheral that provides a serial interface of the microcontroller M. Some of the peripheral's functions include the serialization of parallel data and the insertion of start, parity, and stop bits, or the parallelization of serial data and the separation of start, parity, and stop bits.

Figure 3:
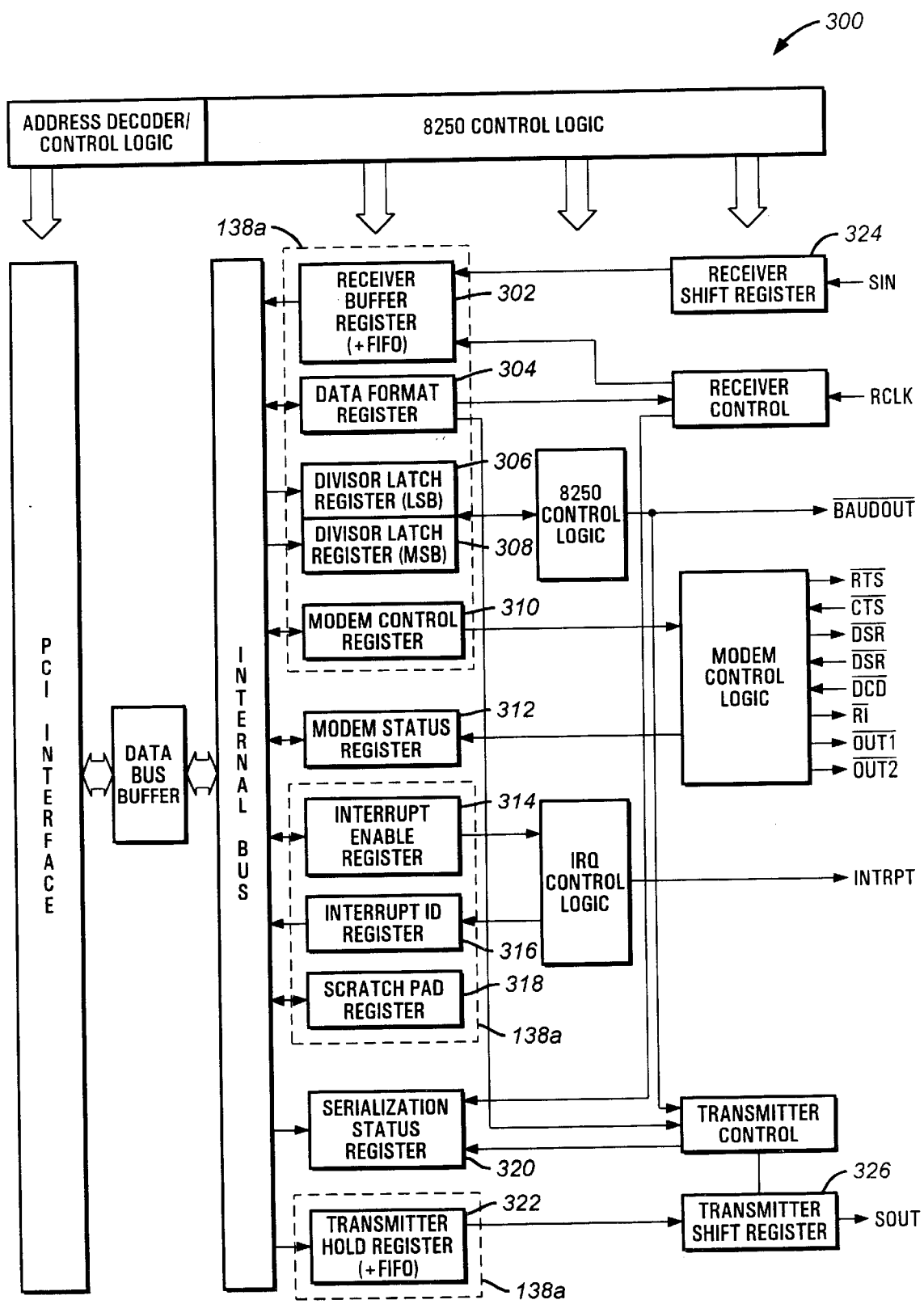
FIG. 3 is a block diagram illustrating the internal registers of a peripheral device, namely a universal asynchronous receiver and transmitter (UART)

FIG. 3 is a block diagram of a typical implementation of the UART 300. The UART 300 has eleven configuration and status registers. The configuration registers include a receiver buffer register 302, data format register 304, divisor latch register (LSB) 306, divisor latch register (MSB) 308, modem control register 310, interrupt enable register 314, interrupt ID register 316, scratch pad register 318, and transmitter hold register 322. The status registers include a modem status register 312 and a serialization status register 320. The registers provide the necessary storage area for interfacing the UART 300 to the rest of the peripheral devices of microcontroller M.

CONFIGURATION STATE REGISTERS

Figure 4:
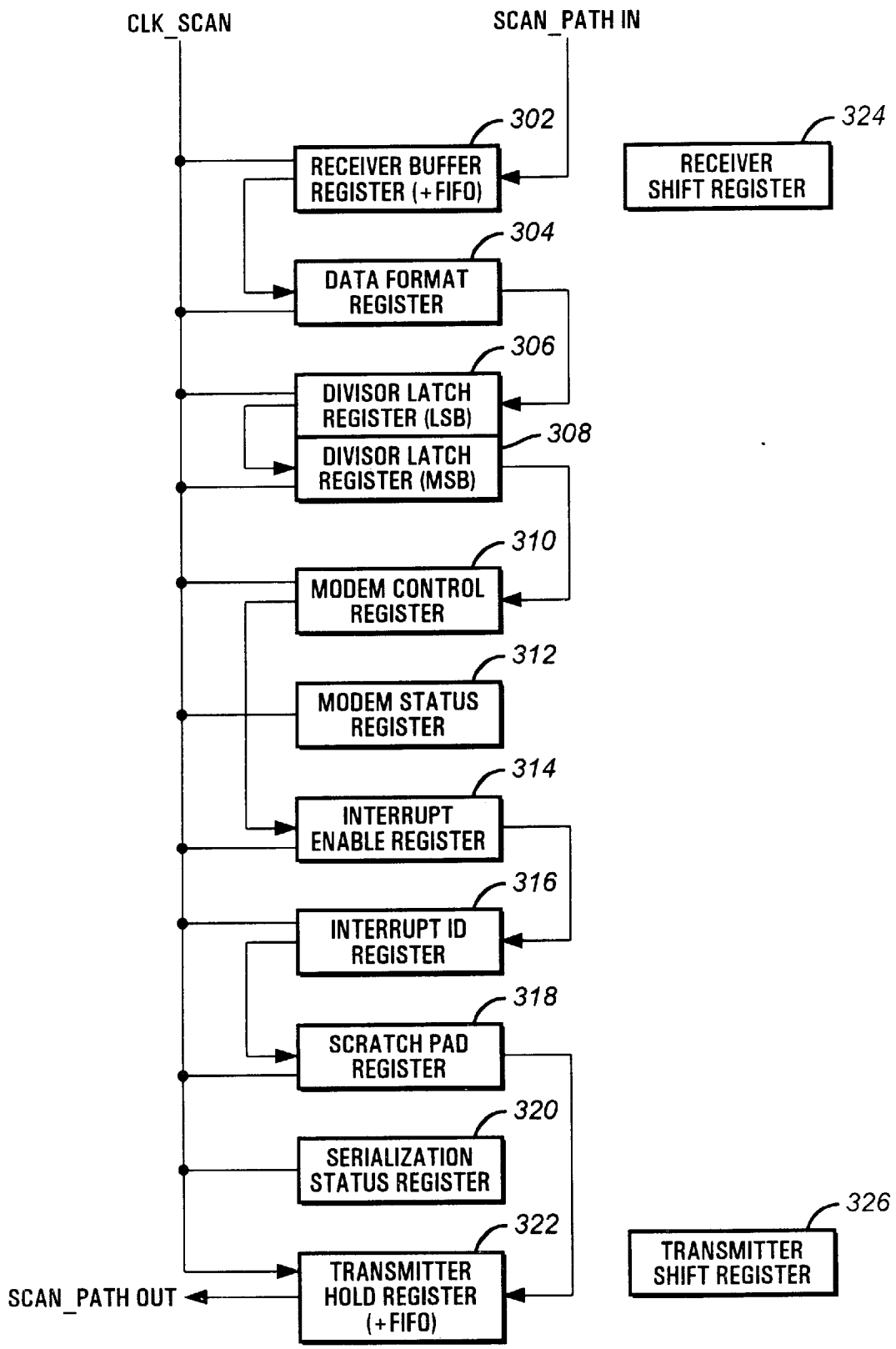
FIG. 4 is a block diagram illustrating configuration registers within a peripheral device.

FIG. 4 is a block diagram of a scan path coupling the registers of a peripheral device. For illustrative purposes, the registers from the UART 300 are shown. Since it is not necessary to capture the data from all registers, the scan path couples those registers used to define the device's configuration. For example, in this implementation the status registers 312 and 320, receiver shift register 324 and transmitter shift register 326 of the device are left out of the scan path. A clock signal CLK_SCAN is provided to the device for synchronous data shifting. The SCAN_PATH IN is coupled to the receiver buffer 302. The SCAN_PATH IN line could have originated from a SCAN_PATH OUT of other peripheral device or from input pin IN. The registers from the receiver buffer 302 are coupled to the data format register 304. Next, the divisor latch (LSB) register 306 is coupled to the divisor latch (MSB) register 308. The divisor latch (MSB) register 308 is then coupled to the modem control register 310. Next, the modem control register 310 is coupled to the interrupt enable register 314, bypassing the modem status register 312. The interrupt enable register 314 is then coupled to the interrupt ID register 316. The interrupt ID register 316 is coupled to the scratch pad register 318. The scratch pad register 318 is coupled to the transmitter hold register 322, bypassing the serialization status register 320. The transmitter hold register 322 is then coupled to the next peripheral configuration register or output pin OUT.

One skilled in the art could appreciate that inclusion or exclusion of particular registers to be saved can be different from system to system. That is, some predetermined subset of configuration registers could differ according to the system. For example, in a high speed system that quickly restarts, it might be desirable to include status registers in the scan path. Thus, the modem status register 312 and/or serialization status register 320 of the UART 300 can be included in the scan path.

In addition, internal registers (as opposed to I/O registers) can be included in the scan path. The contents of these registers are typically not ascertainable without debug tools or the addition of shadow registers, but it might be desirable to include these registers in the scan path. For example, the receiver shift register 324 and/or transmitter shift register 326 of the UART 300 can be included in the scan path.

Furthermore, externally accessible registers (I/O registers) may have read, write, or read/write capabilities. But using standard I/O commands, data cannot be saved from write-only registers nor written to read-only registers. As an example, the receiver buffer register 302 is typically a read-only register. Configuration data normally cannot be loaded into this register with a write command from execution unit 124.

This inability to read from or write to particular registers can present problems when saving and restoring a peripherals state through routines run by the execution unit 124. Typically, when entering and existing low power or hibernation modes, a peripherals state is saved and restored via low level power up and power down routines. But this becomes problematic when read- or write-only registers (or internal hidden registers) are employed. Similar problems arise with locked registers and registers that access different functionality on reads than on writes (i.e., a read returns status; a write alters control).

These legacy-style registers could be made read/write, but that might cause existing software to malfunction. The registers could be made read/write in response to a special mode of operation, but that could require extensive modifications to peripheral cores. Therefore, saving and restoring a peripheral's gracefully can be difficult when the peripheral has read-only, write-only, locked, hidden, or otherwise inaccessible registers.

Using the configuration scan path according to the invention provides a graceful approach to those problems. Whether registers necessary for peripheral configuration are read-only, write-only, hidden, locked, or otherwise difficult to save and restore using processor reads and writes, the configuration scan chain can capture that information.

Returning to the example of the receiver buffer register 302, because it is coupled to the scan path (as shown in FIG. 4), configuration data can be shifted into this register via SCAN_PATH. Likewise, the transmitter hold register 322 typically has write-only capabilities. Data from this register normally cannot be ascertained with I/O commands (or memory commands for memory mapped I/O) from execution unit 124. As shown in FIG. 4, transmitter hold register 322 is coupled to the scan path and configuration data can be shifted out of this register via SCAN_PATH.

Finally, an example of a peripheral device with external registers that cannot be accessed easily by software due to the nature of the hardware. One example is the interrupt control unit 106. A common interrupt control unit is the legacy 8259A style programmable interrupt controller. This controller uses four initialization control words, namely Initialization Command Words (ICW) ICW1–ICW4, which are written sequentially into the device via a single I/O port to four registers. The four registers can be included as configuration registers 108a and are typically write-only registers. Therefore, the registers cannot be read back out. As shown in FIG. 2, coupling the configuration registers 108a to the scan path, configuration states of the interrupt control unit 106 can be loaded into external memory 200.

MEMORY STORAGE DEVICE

Configuration data that is clocked out of the peripheral devices is preferably stored in external memory 200. Configuration data can also be clocked into the peripheral device from external memory 200. Various memory storage devices could be utilized both volatile and non-volatile. One embodiment of the present invention would utilize a serial EEPROM.

IEEE 1149.1 JTAG BOUNDARY SCAN AND TEST ACCESS PORT

Another embodiment of the invention utilizes the JTAG boundary scan path and Test Access Port (TAP) hardware to save the configuration data of the peripheral devices or load configuration data into the peripheral devices. For microcontrollers that are IEEE 1149.1 compliant, the scan paths SCAN_PATH for each peripheral configuration register can be coupled to the boundary scan. The IEEE 1149.1 standard (May 21, 1990), is described in the publication IEEE Standard Test Access Port and Boundary-Scan Architecture, published by the IEEE, Piscataway, N.J. (herein incorporated by reference.)

A command instruction is loaded through the TAP. When the registers are clocked, configuration data is shifted out of the peripheral device register onto the boundary scan path. In addition, the memory storage device could be coupled to the Test Access Port for easy load/storage of configuration data.

FIG. 5 is a flow diagram illustrating the method of saving configuration data according to the invention. The method starts at step 500. A command to initiate configuration save is initiated at step 502. A clock is provided to the configuration registers and external memory 200 at step 504. At each clock cycle, configuration data is shifted from the peripheral configuration registers at step 506. The configuration data is stored in external memory 200 at step 508. If all of the configuration data has not been saved at step 510, the method jumps to step 504. If all configuration data is saved at step 510, the microcontroller is suspended at step 512. The method ends at 514. This could be initiated by a power down routine for example.

FIG. 6 is a flow diagram illustrating the method of loading configuration data according to the invention. The method starts at step 600. A command to initiate configuration load is initiated at step 602. A clock is provided to the configuration registers and external memory 200 at step 604. At each clock cycle, configuration data is loaded into each peripheral configuration register from external memory 200 at step 606. If not all configuration data has been loaded into the peripheral configuration registers, the method jumps to step 604. If all configuration data has been loaded into the peripheral configuration registers than the microcontroller resumes operation at step 610. The method ends at step 612.

The saving of configuration states of peripheral devices can occur during different scenarios. For example, it might be desirable to save the configuration states of peripheral devices prior to a system power down. The states could be saved in non-volatile memory. On power-up, it might be desirable to load the saved states into the peripheral devices as opposed to loading a default configuration setting.

In addition, it might be desirable to save the configuration states of peripheral devices prior to the system entering a sleep or suspend mode. In sleep mode, the system operates under low power. Some peripheral devices might be unable to retain their data while the system is asleep. When the system is awakened or resumes operation, the configuration states can be loaded into the peripheral devices.

Furthermore, it might be desirable to save the configuration states in the event of a system failure. Configuration states can be periodically saved. Thus, if a system failure should occur, the last saved configuration state could be loaded into the peripheral device, instead of loading the default configuration setting.

By saving the configuration states using the scan path, reconfiguration of the peripheral device registers can be accomplished without intervention of the execution unit 124 of microcontroller M. Thus, there would be no need to reload configuration data with I/O commands. As discussed previously, some configuration registers may not be accessible via processor I/O commands because the registers are internal or may be read-only or write-only.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A microcontroller comprising:
an execution unit;
a peripheral device coupled to the execution unit, the peripheral device comprising a plurality of registers, a pre-determined configuration subset of which define a configuration state of the device;
scan logic coupled to the pre-determined configuration subset of the registers and providing a scan path that returns principally configuration information; and
a plurality of additional peripheral devices, each including a plurality of additional registers, a pre-determined configuration subset of which define a configuration state of the additional peripheral device and a scan logic coupled to the configuration subset of the additional registers and providing a scan path.

2. A microcontroller comprising:
an execution unit;
a peripheral device coupled to the execution unit, the peripheral device comprising a plurality of registers, a pre-determined configuration subset of which define a configuration state of the device;
scan logic coupled to the pre-determined configuration subset of the registers and providing a scan path that returns principally configuration information;
means for clocking the configuration state out of the peripheral device via the scan path; and
a plurality of additional peripheral devices, each including a plurality of additional registers, a pre-determined configuration subset of which define a configuration state of the additional peripheral device and a scan logic coupled to the configuration subset of the additional registers and providing a scan path.

3. A method of saving microcontroller peripheral device configuration states comprising the steps of:
initiating a configuration save;
providing a clock cycle to peripheral devices with configuration registers connected via a configuration scan path;
causing configuration data from configuration registers to shift out of scan path;
storing shifted data as configuration data; and
suspending the microcontroller.

4. A method of restoring microcontroller peripheral device configuration states comprising the steps of:
initiating a configuration restore;
providing a clock cycle to peripheral devices with configuration registers connected via a configuration scan path;
causing configuration data from an external memory device to shift out of scan path;
shifting data of which are sufficient to define a configuration state of a plurality of peripheral devices onto a scan path into the peripheral device registers at each clock cycle.

5. The method of claim 4 wherein the configuration registers include registers that are read-only by an execution unit.

* * * * *

UNITED STATES PATENT AND TRADEMARK OFFICE
CERTIFICATE OF CORRECTION

PATENT NO.    : 6,363,501 B1
DATED         : March 26, 2002
INVENTOR(S)   : David F. Tobias, Richard G. Russell and Mark T. Ellis It is certified that error appears in the above-identified patent and that said Letters Patent is hereby corrected as shown below:

<u>Column 5,</u>
Line 58, please replace "existing" with -- exiting --.

Signed and Sealed this

Eighteenth Day of February, 2003

JAMES E. ROGAN
*Director of the United States Patent and Trademark Office*